United States Patent
Ma

(10) Patent No.: US 11,469,328 B2
(45) Date of Patent: Oct. 11, 2022

(54) TFT ARRAY SUBSTRATE AND PREPARATION METHOD THEREOF

(71) Applicant: Shenzhen China Star Optoelectronics Semiconductor Display Technology Co., Ltd., Shenzhen (CN)

(72) Inventor: Qian Ma, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 206 days.

(21) Appl. No.: 16/627,819

(22) PCT Filed: Apr. 24, 2019

(86) PCT No.: PCT/CN2019/084007
§ 371 (c)(1),
(2) Date: Dec. 31, 2019

(87) PCT Pub. No.: WO2020/147216
PCT Pub. Date: Jul. 23, 2020

(65) Prior Publication Data
US 2021/0328072 A1  Oct. 21, 2021

(30) Foreign Application Priority Data

Jan. 16, 2019 (CN) .......................... 201910041297.9

(51) Int. Cl.
*H01L 29/786* (2006.01)
*H01L 27/12* (2006.01)
*H01L 29/66* (2006.01)

(52) U.S. Cl.
CPC ...... *H01L 29/78633* (2013.01); *H01L 27/127* (2013.01); *H01L 27/1237* (2013.01); *H01L 29/66742* (2013.01)

(58) Field of Classification Search
CPC ........... H01L 29/78633; H01L 27/1237; H01L 27/127; H01L 29/66742; H01L 21/77; H01L 27/12
See application file for complete search history.

(56) References Cited

U.S. PATENT DOCUMENTS

2012/0099062 A1\* 4/2012 Chen ................... G02F 1/13718
349/115
2016/0049426 A1\* 2/2016 Lim .................... H01L 27/3276
257/72

(Continued)

FOREIGN PATENT DOCUMENTS

CN          107302032          10/2017
CN          107564945          1/2018
(Continued)

*Primary Examiner* — Mohammed R Alam

(57) ABSTRACT

A preparation method of a thin film transistor (TFT) array substrate includes a step of providing a substrate to prepare a light shielding layer and a buffer layer in sequence on the substrate; and a step of preparing an active layer, a gate insulation layer, a gate, an interlayer insulation layer, and a source/drain metal layer in sequence on the buffer layer; wherein a light absorption layer is prepared on one side of the active layer. Absorbing light prevents most of the light from being reflected to the active layer by disposing a black photoresist below a source and a drain or over the light shielding layer, thereby improving performance of TFT devices.

9 Claims, 9 Drawing Sheets

(56) References Cited

U.S. PATENT DOCUMENTS

2019/0181271 A1    6/2019  Zhang et al.
2019/0207038 A1*   7/2019  Sun .................... H01L 27/3274

FOREIGN PATENT DOCUMENTS

| CN | 107910355 | 4/2018 |
| CN | 108110060 | 6/2018 |
| CN | 108550582 | 9/2018 |
| WO | WO 2013/065569 | 5/2013 |

* cited by examiner

TFT ARRAY SUBSTRATE AND PREPARATION METHOD THEREOF

RELATED APPLICATIONS

This application is a National Phase of PCT Patent Application No. PCT/CN2019/084007 having International filing date of Apr. 24, 2019, which claims the benefit of priority of Chinese Patent Application No. 201910041297.9 filed on Jan. 16, 2019. The contents of the above applications are all incorporated by reference as if fully set forth herein in their entirety.

FIELD AND BACKGROUND OF THE INVENTION

The present disclosure relates to the technical field of displays, and specifically to a thin film transistor (TFT) array substrate and a preparation method thereof.

Top gate self-aligned oxide technology, due to its small parasitic capacitance, is a preferred technology of thin film transistor (TFT) backplane for large-size display panels. A TFT device with top gate self-aligned oxide usually adopts indium gallium zinc oxide (IGZO) as an active layer. Because IGZO is sensitive to light, the TFT device with the oxide is designed to have a light shielding layer for blocking light from a bottom of the TFT device.

However, in an actual fabrication process, since a gate, a source, a drain, and the light-shielding layer of the TFT device are made of metal materials, light will be reflected between metal layers within the device, in which causes that a part of the light will be finally reflected onto the active layer, which in turn affects performance and lifetime of the TFT device.

SUMMARY OF THE INVENTION

A thin film transistor (TFT) array substrate and a preparation method thereof are provided in the present disclosure, which are used to solve problems for the TFT array substrates in the prior art, in which most parts of the TFT device are made of metal materials, light will be reflected between metal layers within the TFT device, that causes a part of the light will be finally reflected onto the active layer, which in turn affects performance and lifetime of the TFT device.

In order to solve the above problem, a technical scheme is provided in the present disclosure as below.

A preparation method of a TFT array substrate is provided in the present disclosure and includes:
a step S10 of providing a substrate to prepare a light shielding layer and a buffer layer in sequence on the substrate; and
a step S20 of preparing an active layer, a gate insulation layer, a gate, an interlayer insulation layer, and a source/drain metal layer in sequence on the buffer layer; wherein a light absorption layer is prepared on one side of the light shielding layer close to the active layer, and the gate and the gate insulation layer are prepared by a single yellow light process.

In at least one embodiment of the present disclosure, the step S10 includes:
a step S101 of providing a substrate to deposit a metal film layer on the substrate;
a step S102 of coating a black photoresist onto a surface of the metal film layer, and exposing and developing the black photoresist to form the light absorption layer;
a step S103 of etching the metal film layer to form a patterned light shielding layer; and
a step S104 of preparing the buffer layer on the light absorption layer.

In at least one embodiment of the present disclosure, a process of preparing the gate and the gate insulation layer includes steps of: depositing a gate insulation material layer on a surface of the active layer;
depositing a gate metal film on a surface of the gate insulation material layer; forming a patterned photoresist on a surface of the gate metal film, and etching the gate metal film to form a patterned gate; and
etching the gate insulation material layer to form a patterned gate insulation layer by self-aligning the patterned gate.

Another preparation method of a TFT array substrate is provided in the present disclosure and includes:
a step S10 of providing a substrate to prepare a light shielding layer and a buffer layer in sequence on the substrate; and
a step S20 of preparing an active layer, a gate insulation layer, a gate, an interlayer insulation layer, and a source/drain metal layer in sequence on the buffer layer; wherein a light absorption layer is prepared on one side of the active layer.

In at least one embodiment of the present disclosure, the light absorption layer is prepared on one side of the light shielding layer close to the active layer.

In at least one embodiment of the present disclosure, the step S10 includes:
a step S101 of providing a substrate to deposit a metal film layer on the substrate;
a step S102 of coating a black photoresist onto a surface of the metal film layer, and exposing and developing the black photoresist to form the light absorption layer;
a step S103 of etching the metal film layer to form a patterned light shielding layer; and
a step S104 of preparing the buffer layer on the light absorption layer.

In at least one embodiment of the present disclosure, the light absorption layer is prepared on one side of the source/drain metal layer close to the active layer.

In at least one embodiment of the present disclosure, the steps S20 includes:
a step S201 of preparing the active layer, the gate insulation layer, and the gate in sequence on the buffer layer;
a step S202 of depositing an inorganic material layer on the buffer layer;
a step S203 of coating a black photoresist on a surface of the inorganic material layer, and exposing and developing the black photoresist to form the light absorption layer;
a step S204 of etching the inorganic material layer to form a patterned interlayer insulation layer; and
a step S205 of preparing the source/drain metal layer on the light absorption layer.

In at least one embodiment of the present disclosure, the gate and the gate insulation layer are prepared by a single yellow light process.

In at least one embodiment of the present disclosure, a process of preparing the gate and the gate insulation layer includes steps of:
depositing a gate insulation material layer on a surface of the active layer;
depositing a gate metal film on a surface of the gate insulation material layer;
forming a patterned photoresist on a surface of the gate metal film, and etching the gate metal film to form a patterned gate; and etching the gate insulation material layer to form a patterned gate insulation layer by self-aligning the patterned gate.

A TFT array substrate is further provided in the present disclosure and includes:

a substrate; a light shielding layer formed on the substrate; a buffer layer formed on the light shielding layer; an active layer formed on the buffer layer; a gate insulation layer formed on the active layer; a gate formed on the gate insulation layer; an interlayer insulation layer formed on the gate; and a source/drain metal layer formed on the interlayer insulation layer; wherein one side of the active layer is provided with a light absorption layer.

In at least one embodiment of the present disclosure, the light absorption layer is disposed on one side of the light shielding layer close to the active layer.

In at least one embodiment of the present disclosure, the light absorption layer and the source/drain metal layer are disposed correspondingly.

In at least one embodiment of the present disclosure, the light absorption layer is disposed on one side of the source/drain metal layer close to the active layer.

In at least one embodiment of the present disclosure, the light absorption layer and the source/drain metal layer are disposed correspondingly.

In at least one embodiment of the present disclosure, the light absorption layer is a black photoresist layer.

Beneficial effects of the present disclosure are that, the light is absorbed by disposing the black photoresist below the source/drain or over the light shielding layer, in which the most of the light can be avoided to reflect onto the active layer, which in turn improves performance of TFT device. In addition, the light absorption layer is formed by the black photoresist that has not been stripped after etching of other layers, thereby being not going to create a new process, simplifying technique and saving cost.

BRIEF DESCRIPTION OF THE SEVERAL VIEWS OF THE DRAWINGS

In order to illustrate more clearly embodiments of the present disclosure or technical solutions in the prior art, drawings required in the embodiments or the prior art described will be briefly described below. Obviously, the drawings in the following description are merely some embodiments of the present disclosure. Accordingly, other drawings may be obtained from those skilled in the art without any creative work.

DESCRIPTION OF SPECIFIC EMBODIMENTS OF THE INVENTION

Figure 1:
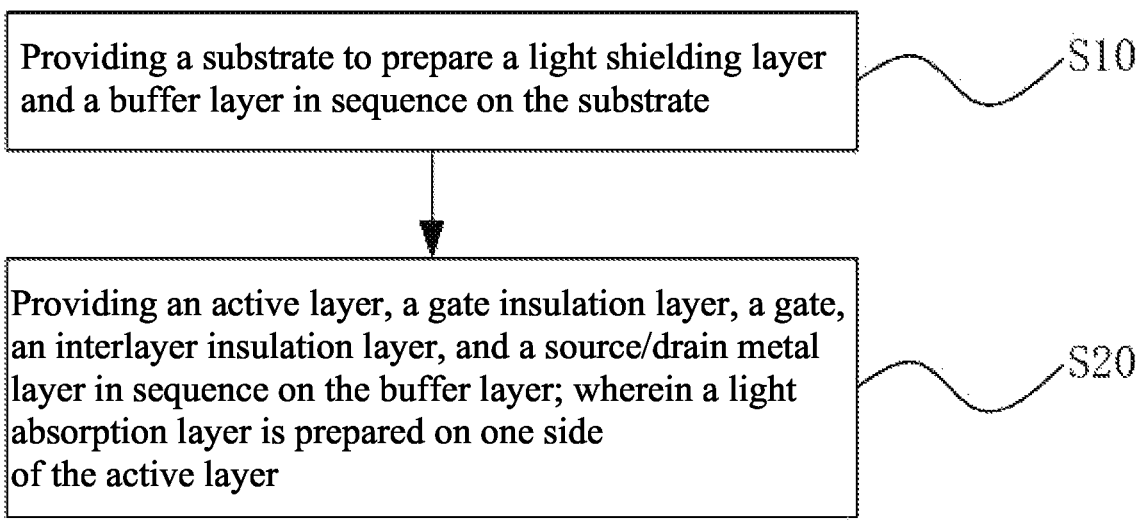
FIG. 1 is a flowchart of a preparation method of a thin film transistor (TFT) array substrate, according to the present disclosure.
Figure 2:
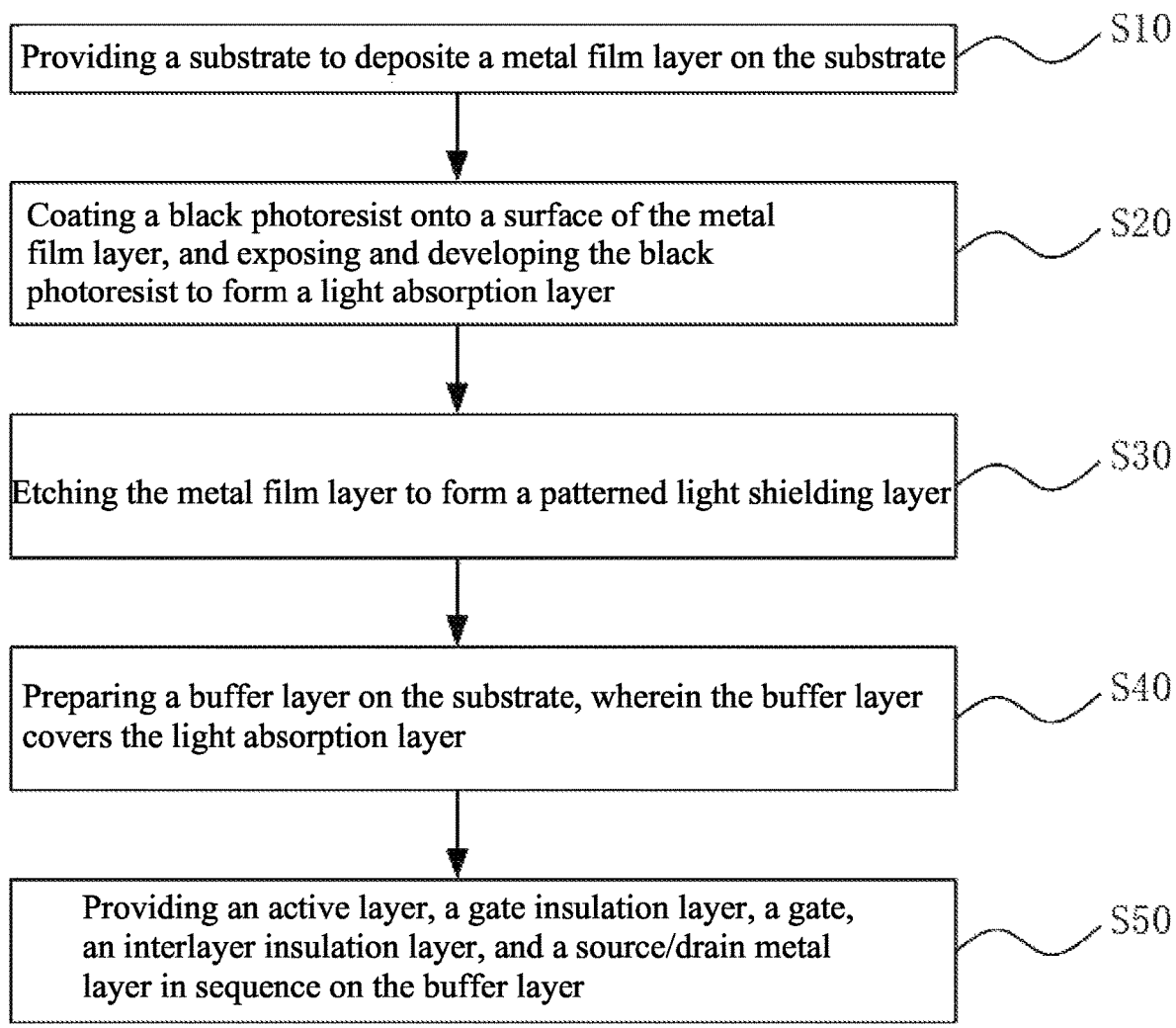
FIG. 2 is a flowchart of a preparation method of the TFT array substrate, according to a first embodiment of the present disclosure.

Following description of the various embodiments is provided to illustrate the specific embodiments of the present disclosure. Furthermore, directional terms mentioned in the present disclosure, such as top, bottom, front, rear, left, right, inner, outer, and lateral, only refer to direction of additional drawings. Therefore, the directional terms are only used for illustrating and understanding of the present disclosure, and are not intended to limit the present disclosure. In the drawings, units with similar structure are denoted by the same reference numerals.

The present disclosure is used to solve problems for a thin film transistor (TFT) array substrates in the prior art, in which most parts of the TFT device are made of metal materials, light will be reflected between metal layers within the TFT device, in which causes that a part of the light will be finally reflected onto the active layer, which in turn affects performance and lifetime of the TFT device. The above defect may be solved by the present embodiment.

As shown in FIG. 1, a preparation method of a TFT array substrate is provided in the present disclosure and includes: a step of providing a substrate to prepare a light shielding layer and a buffer layer in sequence on the substrate; and a step of preparing an active layer, a gate insulation layer, a gate, an interlayer insulation layer, and a source/drain metal layer in sequence on the buffer layer; wherein a light absorption layer is prepared on one side of the active layer.

Because the active layer is sensitive to light, the light is reflected between layers of the gate, the source, the drain, and the light-shielding layer, which are made of metal materials within the TFT device, in which causes that a part of the light will be finally reflected onto the active layer, which affects the performance of the device. Thus, the light absorption layer prepared by the present disclosure mainly plays as a light absorption function for the above metal layer. The light absorption layer may be prepared on one side of the light shielding layer close to the active layer, in order to absorb the light reflected onto the light shielding layer. Alternatively, the light absorption layer may be prepared on one side of the source/drain metal layer close to the active layer, in order to absorb the light reflected onto the source/drain metal layer. The present disclosure will be described in detail with reference to specific embodiments as followings.

First Embodiment

As shown in FIGS. 2 to 5, a preparation method of a TFT array substrate 10 is provided in the present disclosure and includes:

a step S10 of providing a substrate 11 to deposit a metal film layer 121 on the substrate 11;

a step S20 of coating a black photoresist 131 onto a surface of the metal film layer 121, and exposing and developing the black photoresist 131 to form the light absorption layer 13;

a step S30 of etching the metal film layer 121 to form a patterned light shielding layer 12;

a step S40 of preparing the buffer layer 14 on the substrate 11, wherein the buffer layer 14 covers the light absorption layer 13; and a step S50 of an active layer 15, a gate insulation layer 16, a gate 17, an interlayer insulation layer 18, and a source/drain metal layer 19 in sequence on the buffer layer 14.

The preparation method is described in detail as followings.

First, the substrate 11 is cleaned. The substrate 11 may be a glass substrate or a flexible substrate, such as polyimide substrate.

Figure 3:
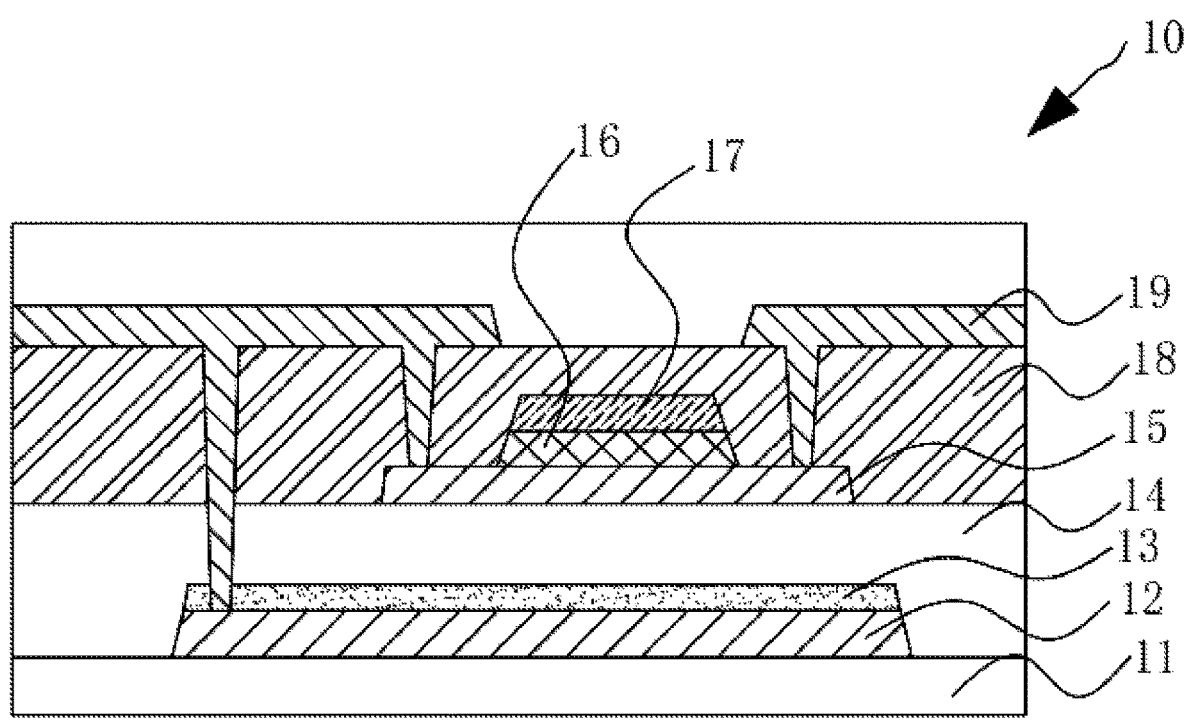
FIG. 3 is a schematic structural diagram illustrating the TFT array substrate, according to the first embodiment of the present disclosure.

As shown in FIG. 3, the light shielding layer 12 is prepared by depositing the metal film layer 121 on the substrate 11. The thickness of the metal film layer 121 is set between 500 to 2000 angstrom. The light shielding layer 12 may be prepared by adopting an alloy consisting of one or two of Mo, Al, Cu and Ti.

Figure 4:
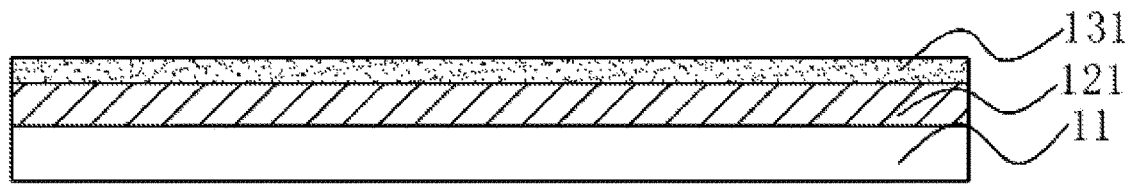
FIGS. 4 to 6 are schematic structural diagrams illustrating preparation processes of the TFT array substrate, according to the first embodiment of the present disclosure.
Figure 5:
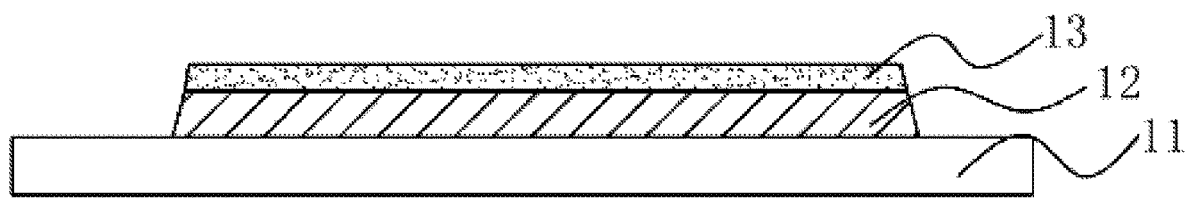

As shown in FIG. 4, the black photoresist 131 is coated onto the surface of the metal film layer 121 and the black photoresist 131 is exposed and developed by using a mask to form the light absorption layer 13 with a predetermined pattern, and then the metal film layer 121 is etched to get a patterned light shielding layer 12. After the above etching process is completed, the black photoresist is not stripped, that is, the light absorption layer 13 is formed over the light shielding layer 13.

Because the light shielding layer 12 is prepared by adopting metal materials, when the light irradiates onto the light shielding layer 12, light will be reflected onto the active layer 15, in which bad effects will be caused on the electrical performance of the TFT devices. Therefore, when the light shielding layer 12 is prepared, the commonly used photoresist material is replaced by a black photoresist. After the etching process is completed, the black photoresist is not stripped, in which light is absorbed and no more redundant process will be created.

Figure 6:
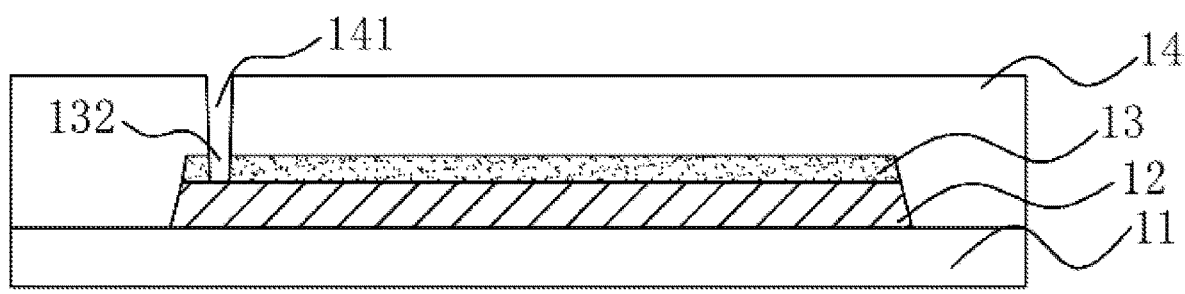

As shown in FIG. 6, silicon oxide or silicon nitride is deposited as the buffer layer 14 on the substrate 11. A first via hole 141 on the buffer layer 14 and a second via hole 132 on the light absorption layer are formed by etching the buffer layer 14 using a single yellow light process. The second via hole 132 and the first via hole 141 are connected to each other to form a passage, in order to implement a source or a drain of the source/drain metal layer 19 in contact with the light shielding layer 12, thereby realizing a signal connection of the light shielding layer 12.

The buffer layer 14 may be a composite structure of a plurality of inorganic film layers. The buffer layer 14 covers the substrate 11 and the light absorption layer 13 to protect the underlying substrate. The buffer layer 14 has an overall thickness between 1000 and 5000 angstroms.

A metal oxide semiconductor material layer is deposited as the active layer 15 on the buffer layer 14. The semiconductor material is one of indium gallium zinc oxide, indium zinc tin oxide, or indium gallium zinc tin oxide. The active layer 15 has a thickness between 100 and 1000 angstroms.

Silicon nitride or silicon oxide is deposited as the gate insulating layer 16 on the active layer 15, and then a metal layer is deposited as the gate 17 on the gate insulating layer 16. The gate insulating layer 16 and the gate 17 are prepared by adopting a single yellow light process, in which a pattern of the gate 17 is first etched and then the gate insulating layer 16 is etched by self-aligning the gate 17. Thus, only a portion of the gate insulating layer 16 below the gate 17 still exists, the remaining portion of the gate insulating layer is etched away.

The active layer 15 is then subjected to a surface plasma process, such that the portion of the active layer 15 covered by the gate insulating layer 16 is not processed to maintain semiconductor characteristics as a channel of the TFT, and the remaining portion of the active layer 15 is processed to reduce resistance and to form an N+ conductor layer.

The gate insulating layer 16 may be a composite structure of a plurality of inorganic film layers. The gate insulating layer 16 has an overall thickness between 1000 and 3000 angstroms.

The gate 17 may be made of one of molybdenum, aluminum, copper, and titanium, or may be made of an alloy consisting of two or more of molybdenum, aluminum, copper, and titanium. The gate electrode 17 has an overall thickness between 2000 and 8000 angstroms.

Silicon oxide or silicon nitride is deposited as an interlayer insulation layer 18 on the buffer layer 14. Another photoresist is coated on the interlayer insulation layer and is exposed and developed by adopting masks with different transmittances for etching the interlayer insulation layer 18. A third via hole and a fourth via hole with different depths are formed on the interlayer insulating layer 18, wherein the depth of the third via hole is greater than the depth of the fourth via hole, and wherein transmittance of the mask corresponding to the third via hole is greater than transmittance of the mask corresponding to the fourth via hole. The third via hole, the second via hole, and the first via hole are connected to each other to form a passage. The interlayer insulating layer 18 has a thickness between 2000 and 10000 angstroms.

A metal layer is deposited as the source/drain metal layer 19 on the interlayer insulating layer 18. The source or the drain of the source/drain metal layer is in contact with the light shielding layer 12 through the third via hole, the first via hole 141, and the second via hole 132, in order to realize the signal connection of the light shielding layer. The source and the drain are connected to the active layer through the fourth via hole. The source/drain metal layer 19 has a thickness between 2000 and 8000 angstroms.

Finally, another inorganic film layer is deposited as a passivation layer on the source/drain metal layer 19. The passivation layer may be adopted by silicon nitride or silicon oxide. The passivation layer has a thickness between 1000 and 5000 angstroms.

The preparation method provided in the present disclosure may be applied to prepare display panels. After the TFT array substrate of the present disclosure is completed, a planarization layer, an anode, a pixel defining layer, a light emitting layer, a packaging layer, and the like may be sequentially prepared on the passivation layer, in order to complete a preparation of the display panel.

Second Embodiment

The above first embodiment is described that a black photoresist is disposed on the light shielding layer. Different from the first embodiment, in the present embodiment, another black photoresist is disposed below the source and the drain of the source/drain metal layer.

Figure 7:
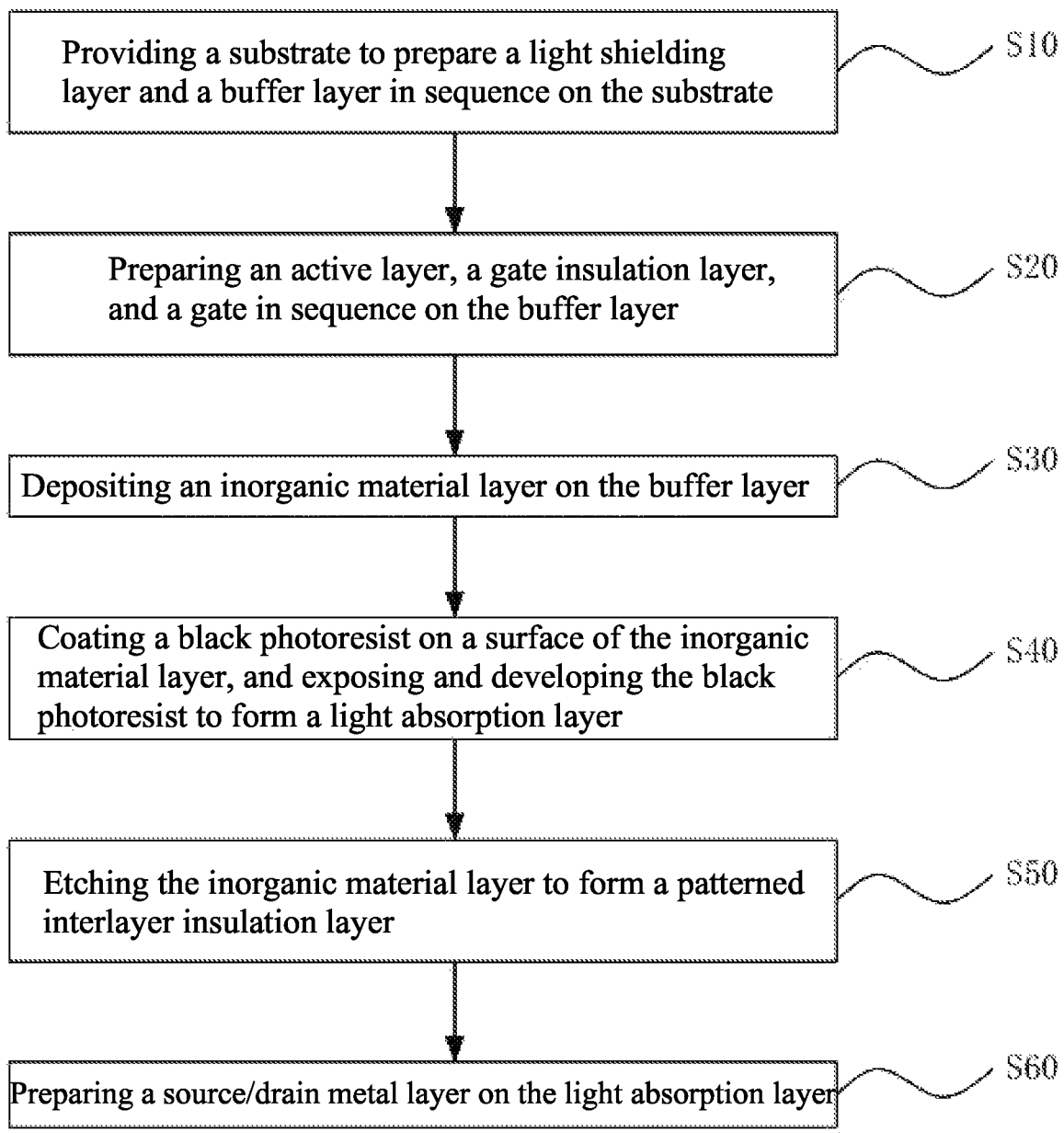
FIG. 7 is a flowchart of the preparation method of the TFT array substrate, according to a second embodiment of the present disclosure.
Figure 8:
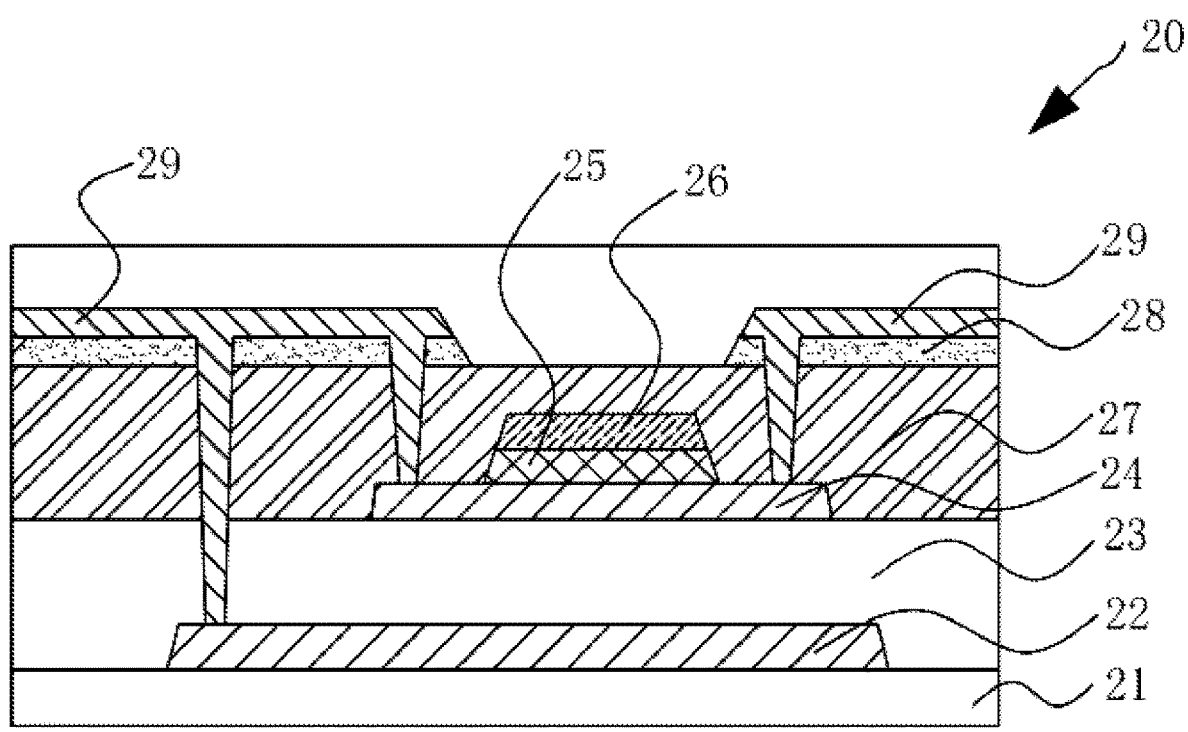
FIG. 8 is a schematic structural diagram illustrating the TFT array substrate, according to the second embodiment of the present disclosure.

As shown in FIGS. 7 and 8, another preparation method of a TFT array substrate 20 is provided in the present embodiment, and includes:

a step S10 of providing a substrate 21 to prepare a light shielding layer 22 and a buffer layer 23 in sequence on the substrate;

a step S20 of preparing an active layer 24, a gate insulation layer 25, a gate 26 in sequence on the buffer layer 23;

a step S30 of depositing an inorganic material layer on the buffer layer 23;

a step S40 of coating a black photoresist on a surface of the inorganic material layer, and exposing and developing the black photoresist to form a light absorption layer 28;

a step S50 of etching the inorganic material layer to form a patterned interlayer insulation layer 27; and a step S60 of preparing a source/drain metal layer 29 on the light absorption layer.

Figure 9:
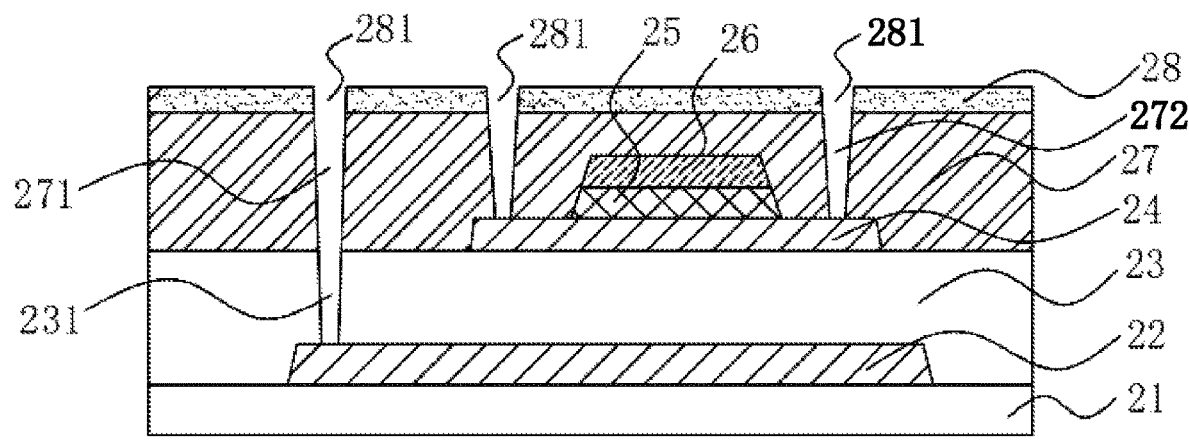
FIGS. 9 to 10 are schematic structural diagrams illustrating preparation processes of the TFT array substrate, according to the second embodiment of the present disclosure.

As shown in FIG. 9, a first via hole 231 is formed on the buffer layer 23, a third via hole 271 and a plurality of fourth via holes 272 are formed on the interlayer insulation layer 27. A plurality of second via holes 281 are formed on the light absorption layer, as shown in FIG. 9. The second via holes 281 and the fourth via holes 272 are connected to each other. A source and a drain of the source/drain metal layer 29 are in contact with the active layer 24 through the second via holes 281 and the fourth via holes 272. The third 271 is connected to one of the second via holes 281 and the first via hole 231 to form a passage. The source or the drain is in contact with the light shielding layer 22 through one of the second via holes 281, the third via hole 271, and the first via hole 231.

In the present embodiment, a preparation of the light absorption layer 28 will be described in detail, another preparation for other layers may be referred to the first embodiment, and will not go into details here.

One inorganic material layer is deposited on the buffer layer 23. The black photoresist is coated on a surface of the inorganic material layer. After the black photoresist is exposed and developed by adopting masks with different transmittances, the light absorption layer 28 with a predetermined pattern is formed and the second via holes 281 are formed on the light absorption layer 28. The inorganic material layer is then etched to form the patterned interlayer insulation layer 27. The third via hole 271 and the fourth via holes 272 are formed on the interlayer insulation layer 27. After the above etching process is completed, the black photoresist is not stripped.

Figure 10:
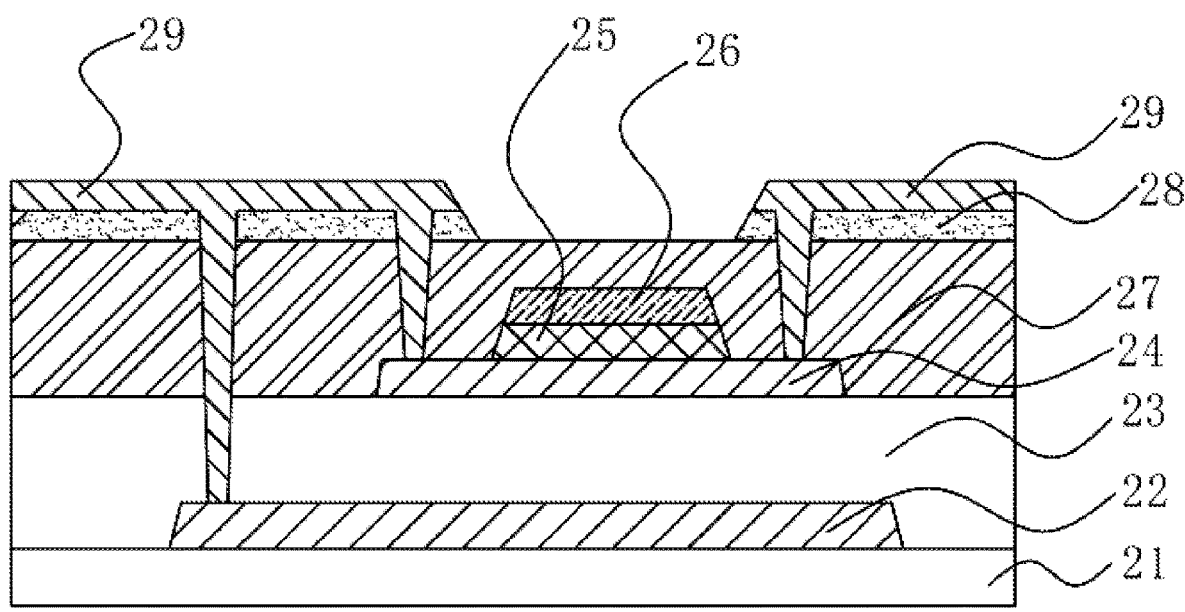

As shown in FIG. 10, one metal layer is deposited on the light absorption layer, the metal layer is then etched by a yellow light process to form the source and the drain of the source/drain metal layer 29, and then the light absorption layer 28 is etched by self-aligning the source and the drain, in order to cause that a portion of the light absorption layer 28 outside a region of the source/drain metal layer 29 is etched away. One black light absorption layer is disposed below the source and the drain of the source/drain metal layer 29, the light reflected between metal layers within the TFT device can be absorbed, thereby reducing the light reflected onto the active layer under the source and the drain. The light absorption layer 28 is a black photoresist layer left after the interlayer insulating layer 27 is etched by using a yellow light process, in which no more redundant process will be created.

A TFT array substrate prepared by the above method is further provided in the present disclosure, and includes a substrate, a light shielding layer, a buffer layer, an active layer, a gate insulation layer, a gate, an interlayer insulation layer, a source/drain metal layer, and a passivation layer stacked in sequence. The TFT array substrate further includes a light absorption layer.

The light absorption layer is disposed on one side of the active layer and is configured to absorb the light reflected between metal layers within the TFT device, thereby avoiding the light entering the active layer.

As shown in FIG. 3, in one embodiment, the light absorption layer 13 is prepared on one side of the light shielding layer 12 close to the active layer 15. Specifically, the light absorption layer 13 may be disposed on a top surface of the light shielding layer 12 to cover the light shielding layer 12 and is configured to absorb the light reflected onto the light shielding layer 12. The light absorption layer 13 is a black photoresist.

As shown in FIG. 8, in another embodiment, the light absorption layer 28 is disposed on one side of the source/drain metal layer 29 close to the active layer 24, that is, the light absorption layer is disposed below the source/drain metal layer 29, wherein the light absorption layer and the source and the drain of the source/drain metal layer are disposed correspondingly, in order to absorb the light reflected onto the source and the drain. The light absorption layer covers the interlayer insulation layer 27. The light absorption layer 28 is a black photoresist.

Beneficial effects of the present disclosure are that, the light is absorbed by disposing the black photoresist below the source/drain or over the light shielding layer, in which the most of the light can be avoided to reflect onto the active layer, which in turn improves performance of TFT device. In addition, the light absorption layer is formed by the black photoresist that has not been stripped after etching of other layers, thereby being not going to create a new process, simplifying technique and saving cost.

In the above, the present disclosure has been disclosed in the above preferred embodiments, but the preferred embodiments are not intended to limit the present disclosure. Various changes and modifications may be made by those skilled in the art without departing from the spirit and scope of the present disclosure. The scope of protection of the present disclosure is subject to the scope defined by the claims.

What is claimed is:

1. A preparation method of a thin film transistor (TFT) array substrate, comprising: a step S10 of providing a substrate to prepare a light shielding layer and a buffer layer in sequence on the substrate; and a step S20 of preparing an active layer, a gate insulation layer, a gate, an interlayer insulation layer, and a source/drain metal layer in sequence on the buffer layer; wherein a light absorption layer is prepared on one side of the light shielding layer close to the active layer, and the gate and the gate insulation layer are prepared by a single yellow light process; and wherein the light absorption layer is disposed between the light shielding layer and the active layer; wherein the step S10 comprises: a step S101 of depositing a metal film layer on the substrate; a step S102 of coating a black photoresist onto a surface of the metal film layer, and exposing and developing the black photoresist to form the light absorption layer; a step S103 of etching the metal film layer to form the light shielding layer; and a step S104 of preparing the buffer layer on the light absorption layer.

2. The preparation method of the TFT array substrate as claimed in claim 1, wherein a process of preparing the gate and the gate insulation layer comprises steps of: depositing a gate insulation material layer on a surface of the active layer; depositing a gate metal film on a surface of the gate insulation material layer; forming a patterned photoresist on a surface of the gate metal film, and etching the gate metal film to form the gate; and etching the gate insulation material layer to form the gate insulation layer by self-aligning the gate.

3. A preparation method of a thin film transistor (TFT) array substrate, comprising: a step S10 of providing a substrate to prepare a light shielding layer and a buffer layer in sequence on the substrate; and a step S20 of preparing an active layer, a gate insulation layer, a gate, an interlayer insulation layer, and a source/drain metal layer in sequence on the buffer layer; wherein a light absorption layer is prepared on one side of the active layer; and wherein the light absorption layer is disposed between the light shielding layer and the active layer; wherein the step S10 comprises: a step S101 of depositing a metal film layer on the substrate; a step S102 of coating a black photoresist onto a surface of the metal film layer, and exposing and developing the black photoresist to form the light absorption layer; a step S103 of etching the metal film layer to form the light shielding layer; and a step S104 of preparing the buffer layer on the light absorption layer.

4. The preparation method of the TFT array substrate as claimed in claim 3, wherein the light absorption layer is prepared on one side of the light shielding layer close to the active layer.

5. The preparation method of the TFT array substrate as claimed in claim 3, wherein the gate and the gate insulation layer are prepared by a single yellow light process.

6. The preparation method of the TFT array substrate as claimed in claim 5, wherein a process of preparing the gate and the gate insulation layer comprises steps of: depositing a gate insulation material layer on a surface of the active layer; depositing a gate metal film on a surface of the gate insulation material layer; forming a patterned photoresist on a surface of the gate metal film, and etching the gate metal film to form the gate; and etching the gate insulation material layer to form the gate insulation layer by self-aligning the gate.

7. A thin film transistor (TFT) array substrate, comprising: a substrate; a light shielding layer formed on the substrate; a buffer layer formed on the light shielding layer; an active layer formed on the buffer layer; a gate insulation layer formed on the active layer; a gate formed on the gate insulation layer; an interlayer insulation layer formed on the gate; and a source/drain metal layer formed on the interlayer insulation layer; wherein one side of the active layer is provided with a light absorption layer; wherein the light absorption layer is disposed between the light shielding layer and the active layer; and wherein the light absorption layer is a black photoresist layer.

8. The TFT array substrate as claimed in claim 7, wherein the light absorption layer is disposed on one side of the light shielding layer close to the active layer.

9. The TFT array substrate as claimed in claim 8, wherein the light absorption layer and the source/drain metal layer are disposed correspondingly.

* * * * *